US011683065B2

(12) United States Patent
Vedula et al.

(10) Patent No.: US 11,683,065 B2
(45) Date of Patent: Jun. 20, 2023

(54) SERIES SHUNT BIASING METHOD TO REDUCE PARASITIC LOSS IN A RADIO FREQUENCY SWITCH

(71) Applicant: QUALCOMM Incorporated, San Diego, CA (US)

(72) Inventors: Ravi Pramod Kumar Vedula, San Diego, CA (US); George Pete Imthurn, San Diego, CA (US); Anton Arriagada, San Marcos, CA (US); Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/150,610

(22) Filed: Jan. 15, 2021

(65) Prior Publication Data

US 2021/0351811 A1 Nov. 11, 2021

Related U.S. Application Data

(60) Provisional application No. 63/022,817, filed on May 11, 2020.

(51) Int. Cl.
*H04B 1/44* (2006.01)
*H03K 17/687* (2006.01)
(52) U.S. Cl.
CPC .......... *H04B 1/44* (2013.01); *H03K 17/6874* (2013.01)

(58) Field of Classification Search
CPC ......... H04B 1/44; H04B 1/48; H03K 17/6874
See application file for complete search history.

(56) References Cited

U.S. PATENT DOCUMENTS

| | | | |
|---|---|---|---|
| 2014/0118053 A1 | 5/2014 | Matsuno | |
| 2017/0201248 A1 | 7/2017 | Scott et al. | |
| 2021/0211127 A1* | 7/2021 | Shanjani | H03K 19/017 |
| 2021/0313982 A1* | 10/2021 | Lin | H03K 17/08142 |

FOREIGN PATENT DOCUMENTS

WO 2017066352 A1 4/2017

OTHER PUBLICATIONS

International Search Report and Written Opinion—PCT/US2021/025256—ISA/EPO—dated Jun. 29, 2021.

* cited by examiner

*Primary Examiner* — Patrick C Chen
(74) *Attorney, Agent, or Firm* — Qualcomm Incorporated

(57) ABSTRACT

A radio frequency (RF) switch includes switch transistors coupled in series. The RF switch includes a distributed gate bias network coupled to gate electrodes of the switch transistors. The RF switch also includes a distributed body bias network coupled to body electrodes of the switch transistors.

24 Claims, 14 Drawing Sheets

SERIES SHUNT BIASING METHOD TO REDUCE PARASITIC LOSS IN A RADIO FREQUENCY SWITCH

CROSS-REFERENCE TO RELATED APPLICATION

The present application claims the benefit of U.S. Provisional Patent Application No. 63/022,817, filed on May 11, 2020, and titled "SERIES SHUNT BIASING METHOD TO REDUCE PARASITIC LOSS IN A RADIO FREQUENCY SWITCH," the disclosure of which is expressly incorporated by reference herein in its entirety.

TECHNICAL FIELD

The present disclosure generally relates to integrated circuits (ICs). More specifically, the present disclosure relates to a series shunt biasing method to reduce parasitic loss in a radio frequency (RF) switch.

BACKGROUND

Design challenges for mobile radio frequency (RF) transceivers include performance considerations for meeting 5G and future 6G transmission frequency specifications. These 5G/6G performance specifications mandate a substantial transmission frequency increase over current standards for transmission frequencies. Transistors are generally selected to operate at substantially higher frequencies for supporting communication enhancements, such as millimeter wave. These transistors may be switch transistors for implementing an RF switch of a mobile RF transceiver.

For example, high performance complementary metal oxide semiconductor (CMOS) RF switch technologies are currently manufactured to implement switch transistors. A series of switch transistors may be configured as an RF switch. Unfortunately, gate bias techniques for controlling the series of switch transistors may reduce a switching speed of the RF switch. The reduced switching speed of the RF switch may prohibit meeting 5G and future 6G transmission frequency specifications when implemented in a mobile RF transceiver.

SUMMARY

A radio frequency (RF) switch includes switch transistors coupled in series. The RF switch includes a distributed gate bias network coupled to gate electrodes of the switch transistors. The RF switch also includes a distributed body bias network coupled to body electrodes of the switch transistors.

A method of constructing a radio frequency (RF) switch including a distributed gate bias network is described. The method includes coupling switch transistors in series from source to drain. The method also includes coupling a shunt gate resistor to a gate of each of the switch transistors. The method further includes coupling a series gate resistor to each shunt gate resistor according to a ladder configuration. The method also includes coupling a shunt body resistor to a body of each of the switch transistors. The method further includes coupling a series body resistor to each shunt body resistor according to the ladder configuration.

A radio frequency (RF) front-end circuit is described. The RF front-end circuit includes an RF switch having switch transistors coupled in series. The RF switch also includes a distributed gate bias network coupled to gate electrodes of the switch transistors. The RF switch further includes a distributed body bias network coupled to body electrodes of the switch transistors. The RF front-end circuit also includes an antenna coupled to the RF switch.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
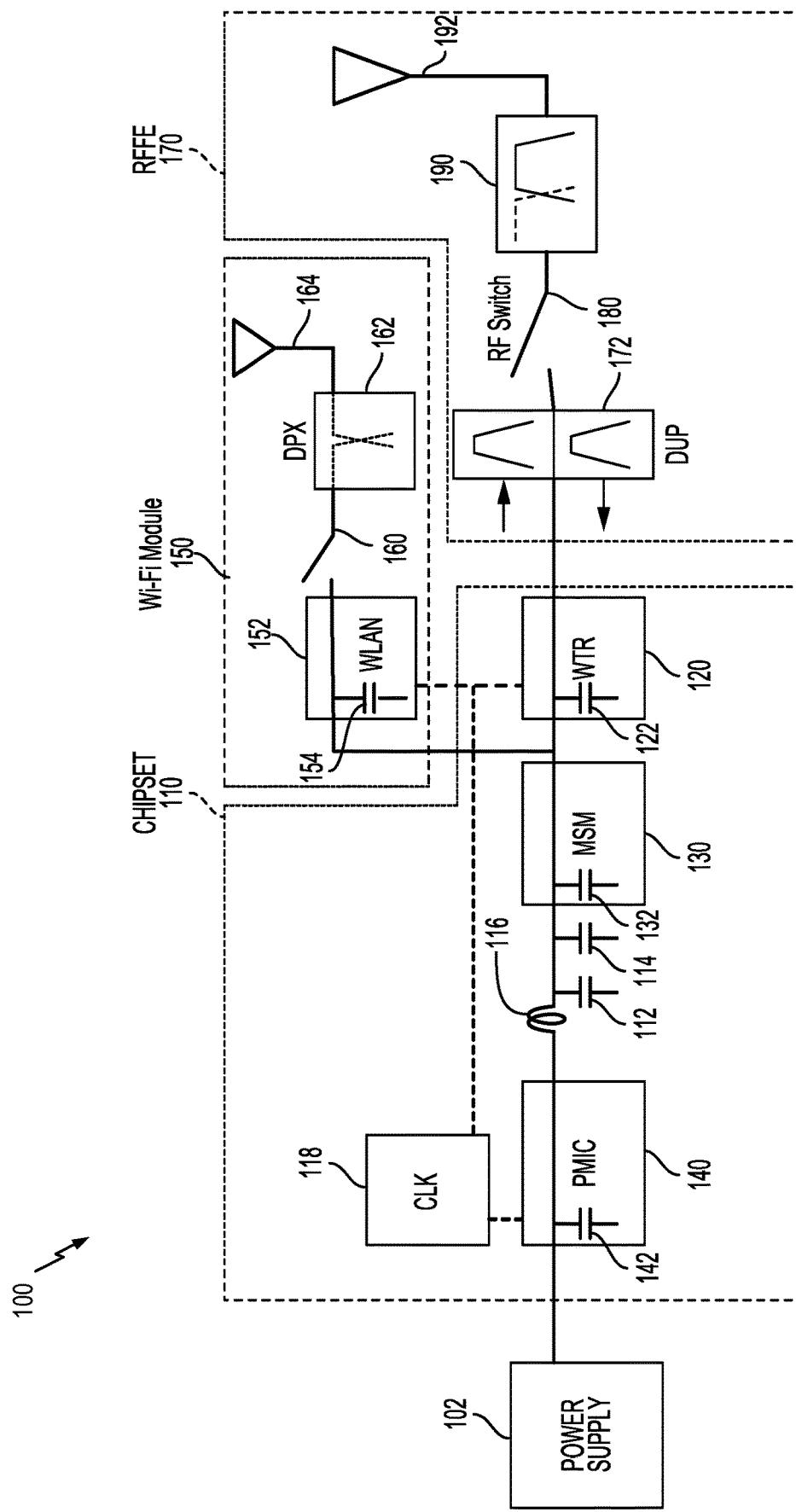
FIG. 1 is a schematic diagram of a wireless device having a wireless local area network module and a radio frequency (RF) front-end module for a chipset.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described, the term "exemplary" used throughout this description means "serving as an example, instance, or illustration," and should not necessarily be construed as preferred or advantageous over other exemplary configurations. As described, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or the object connect is releasable. The connections can be through switches. As described, the term "proximate" used throughout this description means "adjacent, very near, next to, or close to." As described, the term "on" used throughout this description means "directly on" in some configurations, and "indirectly on" in other configurations.

Transmission frequency specifications of 5G/6G protocols mandate a substantial transmission frequency increase (e.g., ten gigabits per second (10 Gbps)) over current standards. Furthermore, various technology innovations are driving the demand for massive wireless communications speed. These technology innovations include, for example, autonomous driving, industrial Internet-of-things (IIOT), remote medical operations/resource sharing, and infotainment/gaming/education. Other technology innovations include interactive collaborations with artificial intelligence (AI) and virtual reality (VR)/artificial reality (AR)/mixed reality (MR)/extended reality (XR) devices. These technology innovations are driving the demand for air interfaces operating at a speed of 10 Gbps with a latency of less than one millisecond (e.g., <1 ms latency).

In addition, media applications are also driving the demand for massive wireless communications speed. In particular, live high definition (HD) video (e.g., 4K/8K) and high frequency voice over Internet protocol (HF VoIP) audio content transmission for mixed reality (MR) and extended reality (XR) applications specify both downlink and uplink speeds much higher than 10 Gbps. These massive data transmission rates may be realized with millimeter wave (mmWave) communications that can offer a wider bandwidth.

Design challenges for mobile radio frequency (RF) transceivers to meet the 5G/6G transmission frequency specifications mandate a substantial transmission frequency increase over current standards. Transistors may be specified to operate at substantially higher frequencies for supporting these communication enhancements, such as mmWave. These transistors may be switch transistors for implementing an RF switch of a mobile RF transceiver.

For example, high performance complementary metal oxide semiconductor (CMOS) RF switch technologies are currently manufactured to implement switch transistors. An RF front-end (RFFE) module or radio frequency (RF) front-end circuit may rely on these high performance CMOS RF switch technologies for successful operation. In practice, a series of RF switch transistors may be configured as an RF switch. Unfortunately, gate and body bias techniques for controlling the series of switch transistors may reduce a switching speed of the RF switch. The reduced switching speed of the RF switch may prevent meeting of 5G and future 6G transmission frequency specifications when implemented in a mobile RF transceiver.

In particular, the gates of RF switch transistors can be biased to turn the switches off. In order to de-couple a direct current (DC) bias from an RF signal of a mobile RF transceiver, a gate resistor (Rg) is placed in series with the gate. A stacked RF switch may be composed of RF switch transistors that are coupled in series to hold off a larger voltage than a single RF switch transistor is capable of handling. Unfortunately, these gate resistors can significantly affect the signal integrity. In operation, the gate resistors work in parallel as a conductance to ground, which significantly increases dissipative losses in the RF switch stack. A conventional solution to solve this problem increases the value of the gate resistors. Unfortunately, increasing a resistance value of the gate resistors adversely affects the switching speed of the RF switch stack.

Various aspects of the present disclosure provide a series shunt biasing method to reduce parasitic loss in a stacked radio frequency (RF) switch. The process flow for semiconductor fabrication of the stacked RF switch may include front-end-of-line (FEOL) processes, middle-of-line (MOL) processes, and back-end-of-line (BEOL) processes. As described, a "distributed gate biasing network" is a network of passive elements that is used to connect the gate electrodes of a series of switches. As described, "stacked switches" are switches stacked in series to accommodate a larger voltage than a single switch of the same type will tolerate. As described, "higher voltage" switches are closer to the high voltage source and "lower voltage" switches are closer to the signal termination or ground.

Aspects of the present disclosure are directed to a series and shunt biasing method to reduce parasitic loss in a stacked RF switch. In one aspect of the present disclosure, shunt gate resistors ($Rgs_{hunt}$) and series gate resistors ($Rg_{series}$) are coupled in a ladder configuration to provide a larger gate resistance value for the higher voltage nodes. This configuration achieves a lower overall parasitic loss to ground, which is represented by the parameter (Rp) and a lower gate resistance value for the lower voltage nodes in order to achieve a lower overall switching time. Although shown as resistors, other passive devices may be arranged in the ladder configuration.

In one aspect of the present disclosure, a ratio (e.g., $Rg_{series}/Rg_{shunt}$) is maintained at a predetermined range (e.g., a range between 1/20 to 1/100) to achieve low RF loss, while maintaining a low switching time. A ladder connected gate bias network has the advantage of increasing the resistance at the higher voltage nodes compared to the lower voltage nodes. In addition, the ladder connected gate bias network reduces switching time and/or a lower parasitic loss to ground (e.g., Rp) compared to a single gate resistor value for the series of gate resistors. The ladder connected gate bias network also reduces area by routing currents from different gate nodes through the same resistor. In addition, parasitic capacitance to the resistors is decreased by reducing the number of resistors.

FIG. 1 is a schematic diagram of a wireless device 100 (e.g., a cellular phone or a smartphone), including stacked radio frequency (RF) switches that include a ladder connected gate bias network. The wireless device 100 has a wireless local area network (WLAN) (e.g., Wi-Fi) module 150 and a radio frequency (RF) front-end module 170 for a chipset 110. The Wi-Fi module 150 includes a first diplexer 162 communicably coupling an antenna 164 to a wireless local area network module (e.g., WLAN module 152). A first RF switch 160 communicably couples the first diplexer 162 to the WLAN module 152. The RF front-end module 170 includes a second diplexer 190 communicably coupling an antenna 192 to the wireless transceiver (WTR) 120 through a duplexer (DUP) 172. A second RF switch 180 communicably couples the second diplexer 190 to the duplexer 172.

The WTR 120 and the WLAN module 152 of the Wi-Fi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the WTR 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The WTR 120 of the wireless device generally includes a mobile RF transceiver to transmit and receive data for two-way communications. The WTR 120 and the RF front-end module 170 may be implemented using high performance complementary metal oxide semiconductor (CMOS) RF switch technologies to implement switch transistors of the first RF switch 160 and the second RF switch 180. An RF front-end module 170 may rely on these high performance CMOS RF switch technologies for successful operation. In practice, a series of RF switch transistors may be configured as an RF switch. An RF switch transistor is shown in FIG. 2.

Figure 2:
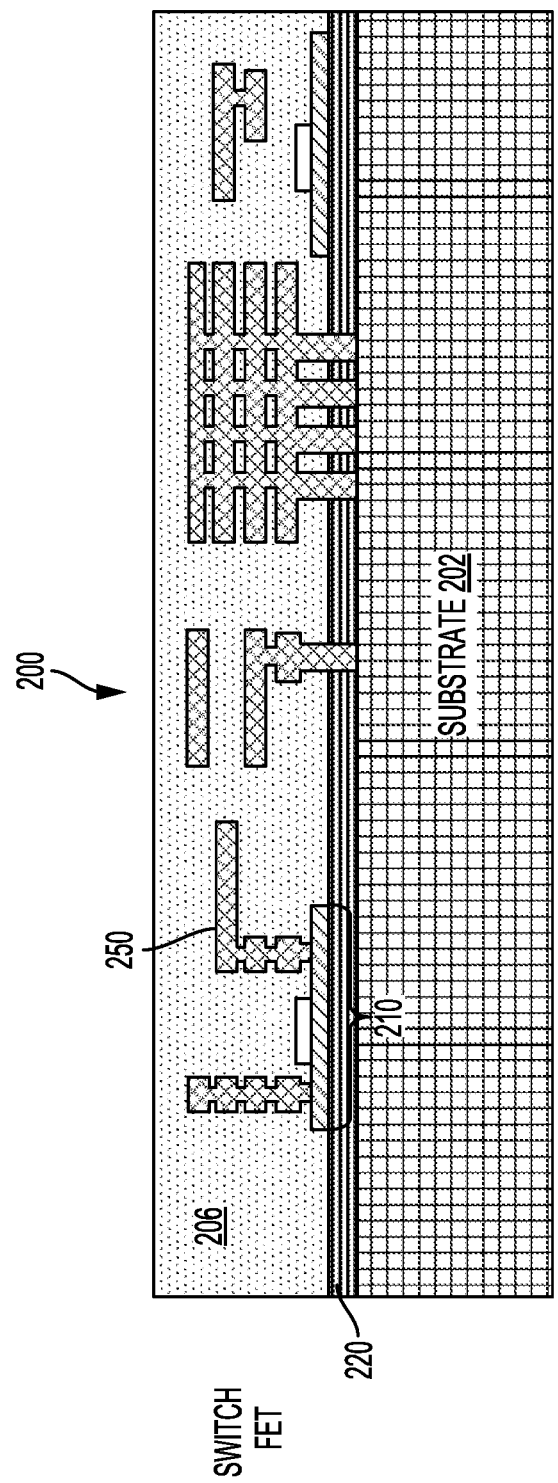
FIG. 2 shows a cross-sectional view of a radio frequency integrated circuit (RFIC), including a switch field effect transistor (FET).

FIG. 2 shows a cross-sectional view of a radio frequency (RF) integrated circuit (RFIC) 200. As shown in FIG. 2, the RFIC 200 includes an active device 210 on an insulator layer 220 (e.g., buried oxide (BOX)) supported by a substrate 202 (e.g., a silicon wafer). The RFIC 200 may be fabricated as a complementary metal oxide semiconductor (CMOS) transistor using a CMOS process. The RFIC 200 also includes interconnects 250 coupled to the active device 210 within a first dielectric layer 206. The active device 210 on the insulator layer 220 may be a CMOS transistor. The RF front-end module 170 (of FIG. 1) may rely on these high performance CMOS RF technologies for successful operation. The RF integrated circuit 200 may implement the RF front-end module 170 in FIG. 1. For example, the active device 210 may be a switch field effect transistor (FET) of the first RF switch 160 of the Wi-Fi module 150 and/or the second RF switch 180 of the RF front-end module 170 (as shown in FIG. 1).

The configuration of the RF front-end module 170 may rely on high performance complementary metal oxide semiconductor (CMOS) RF switch technologies. In particular, the RF front-end module 170 may rely on these high performance CMOS RF switch technologies for successful operation of the second RF switch 180 (and/or the first RF switch 160). In practice, a series of RF switch transistors may be configured as an RF switch. Unfortunately, gate and body bias techniques for controlling the series of switch transistors may reduce a switching speed of the RF switch. The reduced switching speed of the RF switch may prohibit meeting 5G and future 6G transmission frequency specifications when implemented in a mobile RF transceiver.

Figure 3:
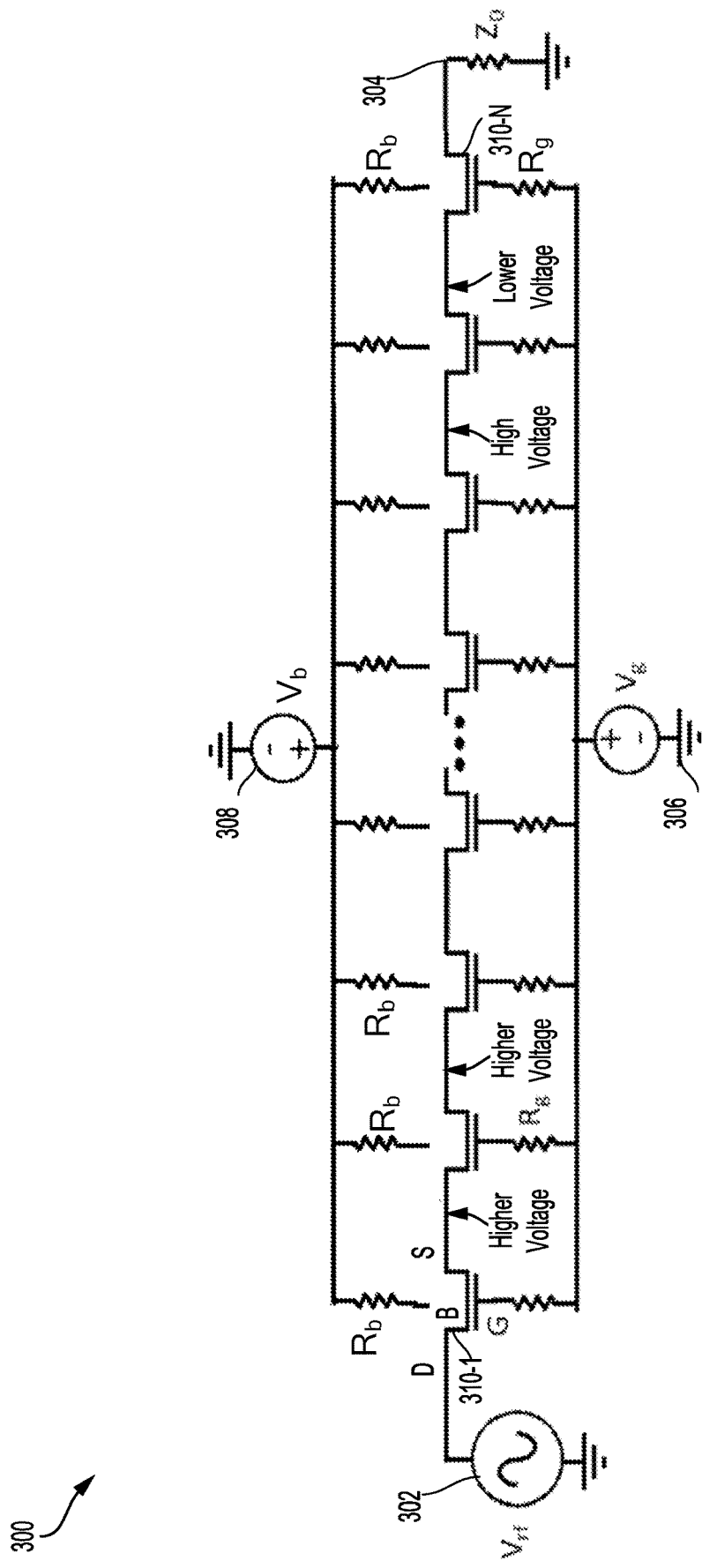
FIG. 3 is a schematic diagram illustrating a configuration of a stacked radio frequency (RF) switch transistor, according to aspects of the present disclosure.

FIG. 3 is a schematic diagram illustrating a configuration of a stacked radio frequency (RF) switch transistor, according to aspects of the present disclosure. In the schematic representation of FIG. 3, a stacked RF switch 300 is composed of RF switch transistors 310 (310-1, . . . , 310-N) coupled in series to hold off a larger voltage than a single RF switch transistor is capable of handling. In this configuration, an RF source 302 (e.g., an RF voltage ($V_{rf}$)) is coupled to a drain (D) of a first (e.g., 310-1) of the RF switch transistors 310 (e.g., N-type CMOS switch transistors). The RF switch transistors 310 are connected in series (e.g., source (S) to drain (D)), with a load 304 ($Z_0$) coupled to a last (e.g., 310-N) of the RF switch transistors 310.

In this configuration, the RF switch transistors 310 are shown as four terminal devices, in which the gates (G) and the bodies (B) of the RF switch transistors 310 are biased to turn the switches off. In particular, to de-couple a direct current (DC) bias from an RF signal of, for example, a mobile RF transceiver, a gate resistor (Rg) is placed in series with the gate (G) of each of the RF switch transistors 310. In addition, a body resistor (Rb) is placed in series with the body (B) of each of the RF switch transistors 310 Unfortunately, these gate resistors Rg and body resistors Rb can significantly affect the signal integrity of the RF signal.

In operation, the gate resistors Rg work in parallel as a conductance to ground (e.g., gate voltage ($V_g$) 306), which significantly increases dissipative losses in the stacked RF switch 300. Similarly, the body resistors Rb work in parallel as a conductance to ground (e.g., body voltage ($V_b$) 308), which further increases dissipative losses in the stacked RF switch 300. A conventional solution to this problem increases a resistance value of the gate resistors Rg and/or the body resistors Rb. Unfortunately, increasing the resistance value of the gate resistors Rg and/or the body resistors Rb adversely affects the switching speed of the stacked RF switch 300.

In particular, the net effect from parasitic losses to ground in the stacked RF switch 300 is represented by the parameter Rp. Rp is calculated from the measured scattering (s)-parameters, being equal to 1/real[Y(11)] (e.g., admittance Y-matrix parameters). At low frequencies, the parasitic loss Rp is equal to the value of the gate bias resistors (e.g., the gate resistors Rg) in parallel. A standard method for improving the parasitic loss Rp is to uniformly increase the resistance value of the gate resistors (Rg). Unfortunately, this leads to the undesired result of a larger resistance-capacitance (RC) time constant (e.g., RgCox), in which Cox is a capacitance associated with the RF switch transistors 310. That is, the larger RgCox time constant of a gate bias circuit lengthens the time it takes to switch the RF switch transistors 310 from ON-to-OFF or OFF-to-ON.

In this configuration, when the RF switch transistors 310 are OFF, the RF source 302 ($V_{rf}$) is divided by the OFF-state capacitance of the RF switch transistors 310. This results in higher voltages at the RF switch transistors 310 (e.g., 310-1) closer to the RF source 302, and lower voltages at the RF switch transistors 310 (e.g., 310-N) closer to the load 304. Thus, the gate nodes at the higher voltage drain D and source S nodes (e.g., of RF switch transistor 310-1) are subject to higher voltages than the gate nodes at the lower voltage drain and source nodes (e.g., of RF switch transistor 310-N).

FIGS. 4A-4D are schematic diagrams illustrating configurations of stacked radio frequency (RF) switches including ladder connected body bias networks and gate bias networks, according to aspects of the present disclosure. In the schematic representation of FIG. 4A, a stacked RF switch 400 is composed of RF switch transistors 410 (410-1, . . . , 410-N) coupled in series to hold off a larger voltage than a single RF switch transistor is capable of handling. In this configuration, an RF source 402 (e.g., an RF voltage ($V_{rf}$)) is coupled to a drain (D) of a first of the RF switch transistors 410 (e.g., an N-type CMOS transistor). The RF switch transistors 410 are connected in series (e.g., source (S) to drain (D)), with a load 404 ($Z_0$) and a ground (e.g., gate voltage ($V_g$) 406) coupled to a last of the RF switch transistors 410 (e.g., 410-N).

In aspects of the present disclosure, a series shunt biasing method forms a distributed gate bias network 420. In one configuration, the distributed gate bias network 420 is composed of shunt gate resistors ($Rg_{shunt}$) and series gate resistors ($Rg_{series}$) in a ladder configuration. In this configuration, the distributed gate bias network 420 is coupled to each of the gates G of the RF switch transistors 410. By connecting the shunt gate resistors $Rg_{shunt}$ and series gate resistors $Rg_{series}$ in the ladder configuration, the distributed gate bias network 420 provides a larger effective impedance value for the higher voltage nodes of the RF switch transistors 410 (e.g., 410-1), while using smaller gate resistance values. Providing the larger effective impedance value for the higher voltage nodes of the RF switch transistors 410 (e.g., 410-1) achieves a higher Rp impedance (e.g. a lower parasitic loss to ground). In addition, the distributed gate bias network 420 provides a lower gate resistance value for the lower voltage nodes of the RF switch transistors 410 (e.g., 410-N). Providing the lower gate resistance value for the lower voltage nodes of the RF switch transistors 410 (e.g., 410-N) achieves a lower overall switching time.

In this aspect of the present disclosure, the series shunt biasing method also forms a distributed body bias network 430. In one configuration, the distributed body bias network 430 is composed of shunt body resistors ($Rb_{shunt}$) and series body resistors ($Rb_{series}$) in a ladder configuration. In this configuration, the distributed body bias network 430 is coupled to each body B of the RF switch transistors 410. In addition, an AC ground (e.g., body voltage ($V_b$) 408) is coupled to the last of the RF switch transistors 410 (e.g., 410-N). By connecting the shunt body resistors $Rb_{shunt}$ and the series body resistors $Rb_{series}$ in the ladder configuration, the distributed body bias network 430 provides a larger body resistance value for the higher voltage nodes of the RF switch transistors 410 (e.g., 410-1). Providing the larger body resistance value for the higher voltage nodes of the RF switch transistors 410 (e.g., 410-1) achieves a lower RF parasitic loss to ground (higher impedance). In addition, the distributed body bias network 430 provides a lower body resistance value for the lower voltage nodes of the RF switch transistors 410 (e.g., 410-N). Providing the lower body resistance value for the lower voltage nodes of the RF switch transistors 410 (e.g., 410-N) achieves a lower overall switching time.

In one aspect of the present disclosure, the distributed gate bias network 420 is configured to maintain a ratio between the series and shunt gate resistors (e.g., $Rg_{series}/Rg_{shunt}$). Similarly, the distributed body bias network 430 is configured to a ratio between the series and shunt body resistors (e.g., $Rb_{series}/Rb_{shunt}$). According to this aspect of the present disclosure, the $Rg_{series}/Rg_{shunt}$ ratio (and/or the $Rb_{series}/Rb_{shunt}$ ratio) is maintained at a predetermined range (e.g., between 1/20 to 1/100) to achieve low RF parasitic loss, while maintaining a low switching time of the stacked RF switch 400.

This configuration of the distributed gate bias network 420 and the distributed body bias network 430 has the advantage of increasing the resistance at the higher voltage nodes of the RF switch transistors 410 (e.g., 410-1) compared to the lower voltage nodes of the RF switch transistors 410 (e.g., 410-N). In addition, the ladder configuration of the distributed gate bias network 420 and the distributed body bias network 430 reduces a switching time and/or a reduces parasitic loss to ground (e.g., higher Rp) compared to a single gate resistor value for the gate resistors $Rg_{series}$ (and/or the series body resistors $Rb_{series}$). The ladder configuration of the distributed gate bias network 420 and the distributed body bias network 430 also reduces area by routing currents from different gate nodes (and/or body nodes) through the same resistor $Rg_{series}$ (and/or $Rb_{series}$). In addition, parasitic capacitances intrinsic to Rbshunt and Rgshunt of large area owing to larger values can be y reduced by the lower value of resistors $Rg_{shunt}$ and $Rg_{series}$ (and/or $Rb_{series}$ and $Rb_{shunt}$), achieving higher Rp impedance.

Figure 4A:
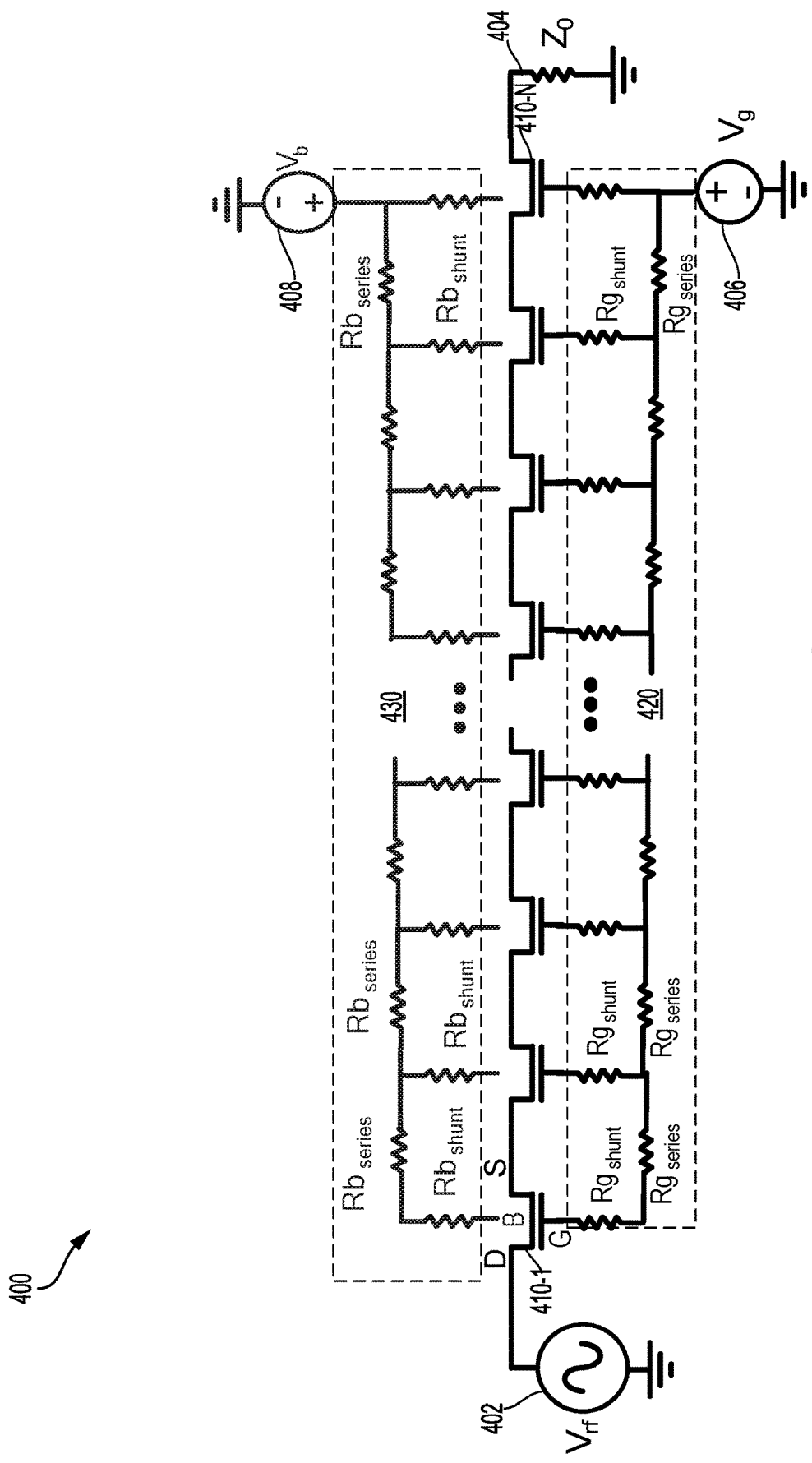
FIGS. 4A-4D are schematic diagrams illustrating configurations of a stacked radio frequency (RF) switch including a distributed gate bias network and a distributed body bias network, according to aspects of the present disclosure.
Figure 4B:
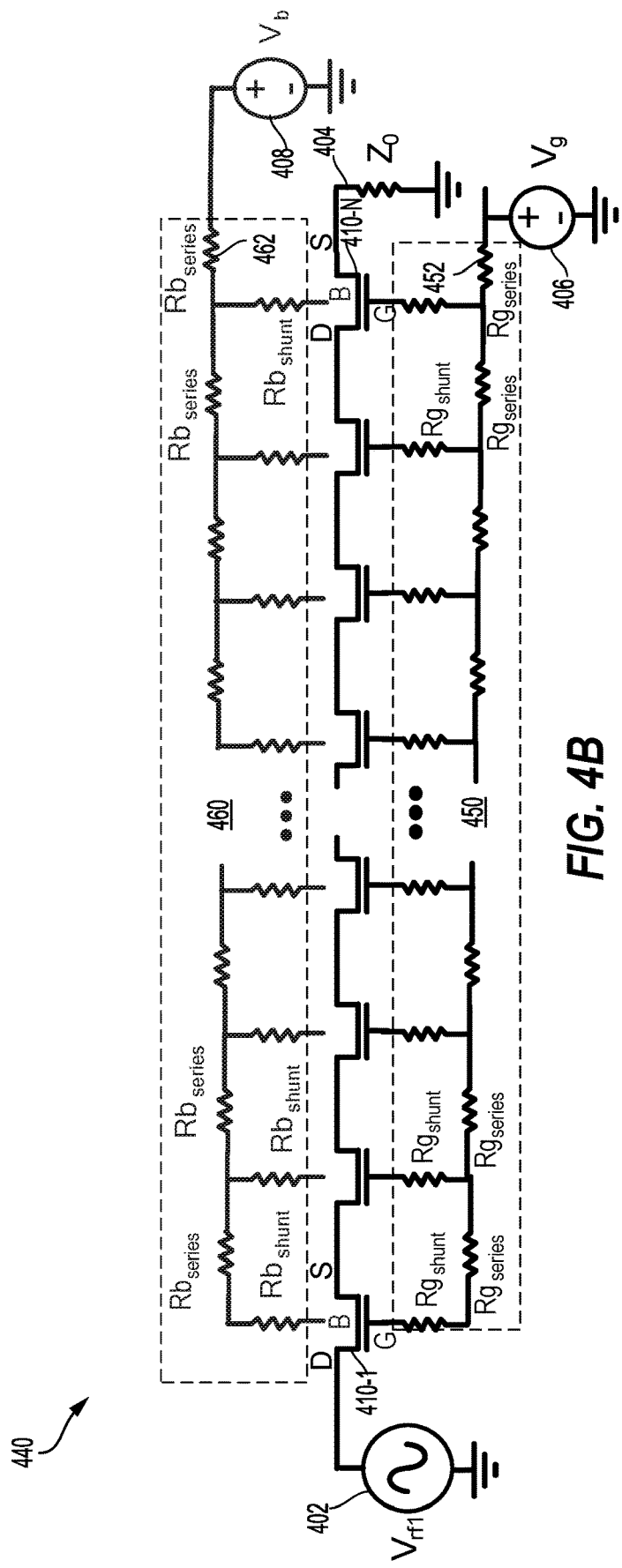

In the schematic representation of FIG. 4B, a stacked RF switch 440 is also configured with the RF switch transistors 410 (410-1, . . . , 410-N) of the stacked RF switch 400 of FIG. 4A. In one configuration, the stacked RF switch 440 includes a distributed gate bias network 450, which is a variation of the distributed gate bias network 420 shown in FIG. 4A. In this example, the distributed gate bias network 450 includes a last gate resistor 452 coupled to a shunt gate resistor $Rg_{shunt}$ coupled to the last of the RF switch transistors 410 (e.g., 410-N). In this configuration, the RF ground (e.g., DC gate voltage ($V_g$) 406) is coupled to the last gate resistor 452.

In one configuration, the stacked RF switch 440 also includes a distributed body bias network 460. In this example, the distributed body bias network 460 is a variation of the distributed body bias network 430 shown in FIG. 4A. For example, the distributed body bias network 460 includes a last body resistor 462 coupled to a shunt body resistor $Rb_{shunt}$, which is coupled to the body of the last of the RF switch transistors 410 (e.g., 410-N). In this configuration, the RF ground (e.g., DC body voltage ($V_b$) 408) is coupled to the last body resistor 462.

Figure 4C:
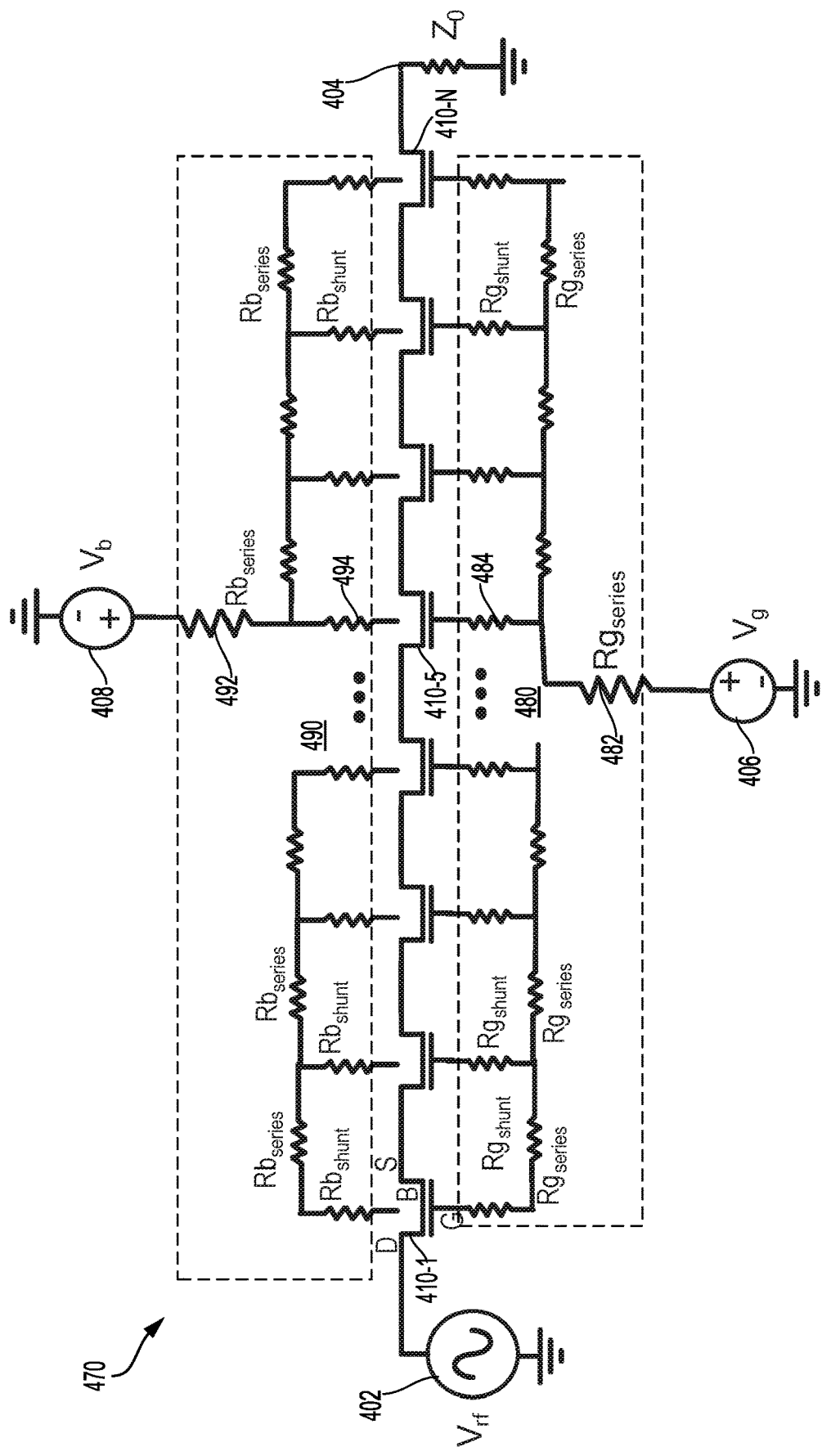

In the schematic representation of FIG. 4C, a stacked RF switch 470 is also configured with the RF switch transistors 410 (410-1, . . . , 410-N) of the stacked RF switch 400 of FIG. 4A. In this configuration, the stacked RF switch 470 includes a distributed gate bias network 480, which is a variation of the distributed gate bias network 420 shown in FIG. 4A. In this example, the distributed gate bias network 480 is configured with a series gate resistor ($Rg_{series}$) 482 coupled to an intermediate gate series, node of the RF switch transistors 410 (e.g., 410-5) through a shunt gate resistor ($Rg_{shunt}$) 484. According to aspects of the present disclosure, the intermediate gate node of the RF switch transistors 410 (e.g., 410-5) is selected based on a design tradeoff between depending on the effective impedance Rp and switching time. In addition, the AC ground (e.g., DC gate voltage ($V_g$) 406) is coupled to the series gate resistor 482.

In one configuration, the stacked RF switch 470 also includes a distributed body bias network 490, which is a variation of the distributed body bias network 430 shown in FIG. 4A. In this example, the distributed gate bias network 480 is configured with a series body resistor ($Rb_{series}$) 492 coupled to an intermediate body node of the RF switch transistors 410 (e.g., 410-5) through a shunt body resistor ($Rb_{shunt}$) 494. According to aspects of the present disclosure, the intermediate one of the RF switch transistors 410 (e.g., 410-5) is selected based on a design tradeoff between depending on the effective impedance Rp and switching time. This choice can further be the same or different from choice of the intermediate node choice for the gate network. In addition, the RF ground (e.g., DC body voltage ($V_b$) 408) is coupled to the series body resistor 492.

Figure 4D:
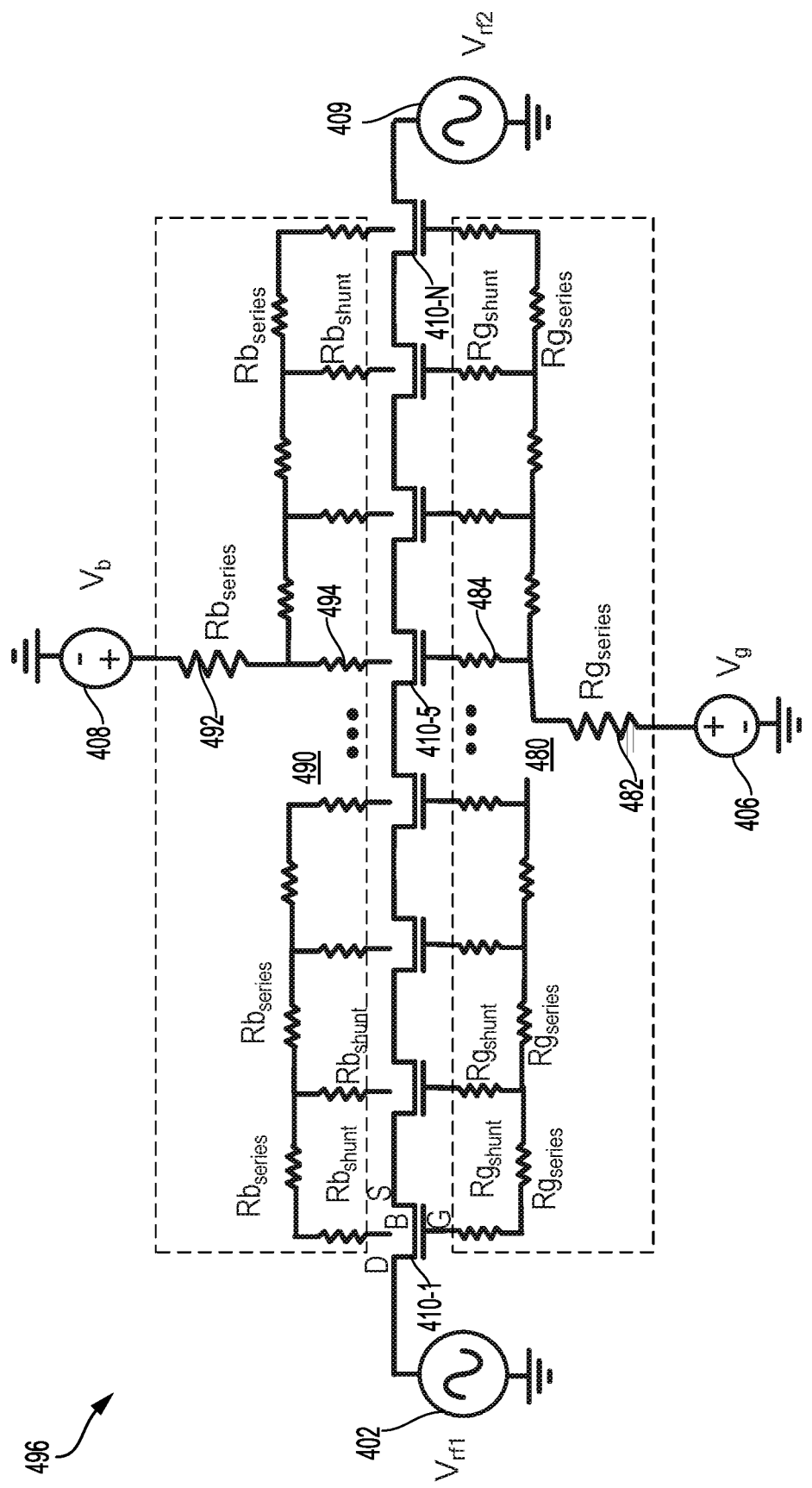

In the schematic representation of FIG. 4D, a stacked RF switch 496 is also configured with the RF switch transistors 410 (410-1, . . . , 410-N) of the stacked RF switch 400 of FIG. 4A. The RF switch transistors 410 are coupled in series to hold off a larger voltage than a single RF switch transistor is capable of handling. In this configuration, the stacked RF switch 496 includes the distributed gate bias network 480 and the distributed body bias network 490 of FIG. 4C. In this example, a first RF source 402 (e.g., an RF voltage ($V_{rf2}$)) is coupled to the drain (D) of the first of the RF switch transistors 410 (410-1) and a second RF source 409 (e.g., an RF voltage ($V_{rf2}$)) is coupled to a source (S) of the last of the RF switch transistors 410 (e.g., 410-N).

FIGS. 5A-5D are schematic diagrams illustrating configurations of stacked radio frequency (RF) switches including distributed gate bias networks and distributed body bias networks, according to further aspects of the present disclosure. In the schematic representation of FIG. 5A, a stacked RF switch 500 is composed of RF switch transistors 510 (510-1, . . . , 510-N) coupled in series. In this configuration, a first RF source 502 ($V_{rf1}$) is coupled to a drain (D) of a first of the RF switch transistors 510 (e.g., 510-1). The RF switch transistors 510 are connected in series (e.g., source (S) to drain (D)), with a load 504 ($Z_0$) and a ground (e.g., a gate voltage ($V_g$) 506) coupled to a last of the RF switch transistors 510 (e.g., 510-N).

Figure 5A:
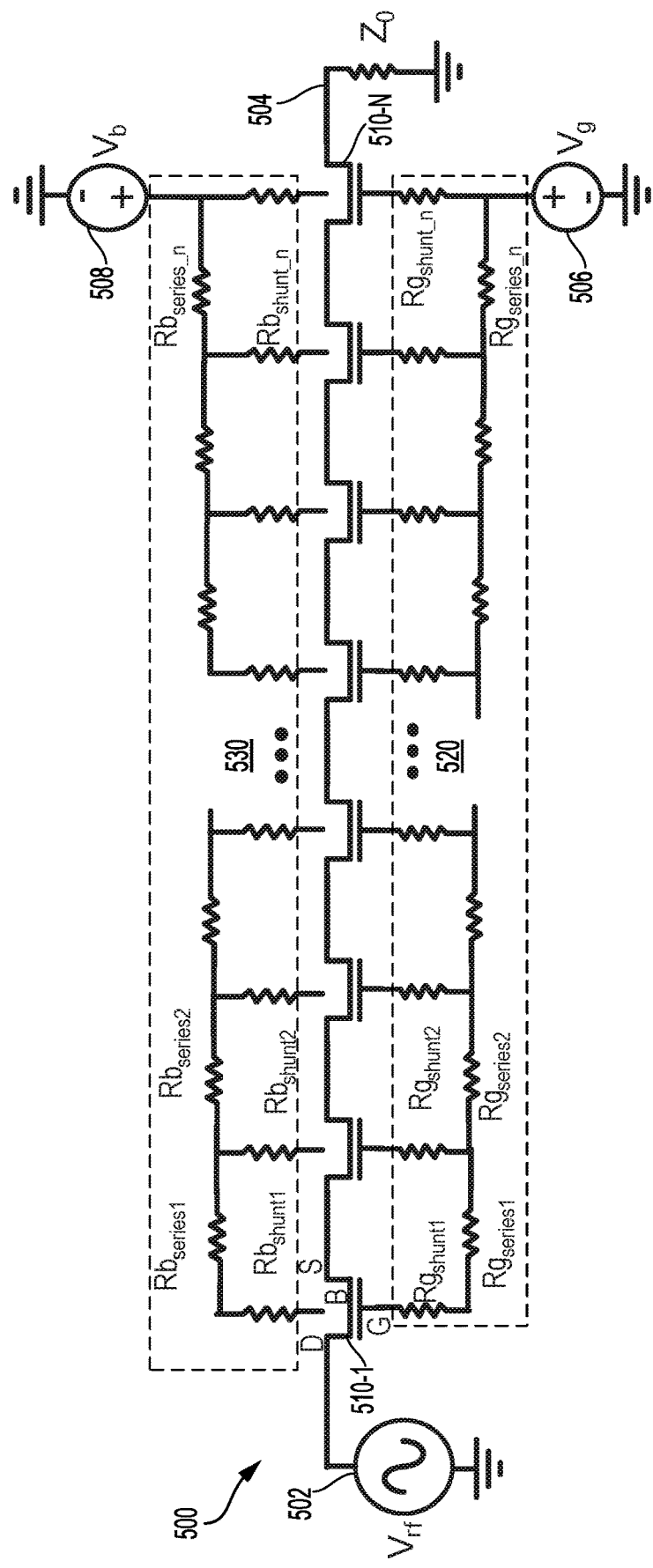
FIGS. 5A-5D are schematic diagrams illustrating configurations of stacked radio frequency (RF) switches including distributed gate bias networks and distributed body bias networks, according to further aspects of the present disclosure.

While the stacked RF switch 500 of FIG. 5A is similar to the stacked RF switch 400 of FIG. 4A, the stacked RF switch 500 includes a distributed gate bias network 520 and a distributed body bias network 530. According to this aspect of the present disclosure, the distributed gate bias network 520 and the distributed body bias network 530 increase the impedance (e.g., load 504 ($Z_0$)) seen by the gates and bodies of the RF switch transistors 510 (e.g., 510-1) that are at higher voltages.

In this aspect of the present disclosure, the distributed gate bias network 520 is configured with shunt gate resistors $Rg_{shunt}$ that have varying resistance values (e.g., $Rg_{shunt1}$, $Rg_{shunt2}$, etc.) depending on the location in the stacked RF switch 500. In addition, the distributed gate bias network 520 is configured with series gate resistors that have a varying resistance value (e.g., $Rg_{series1}$, $Rg_{series2}$, etc.) depending on the location (e.g., respective position) in the stacked RF switch 500. For example, the shunt gate resistors $Rg_{shunt}$ have a first varying resistance value according to a position with respect to the switch transistors 510, and the series gate resistors $Rg_{series}$ have a second varying resistance value according to a position with respect to the switch transistors 510.

By contrast, in FIG. 4A, the distributed gate bias network 420 is configured using shunt gate resistors $Rg_{shunt}$ having the same value and series gate resistors $Rg_{series}$ having the same value. This configuration increases the impedance seen by the gates of the RF switch transistors 510 (e.g., 510-1) that are at higher RF node voltages by using a combination of Rseries paths to break the inherent parallelism of Rgshunt network and consequently resulting in lower RF gate currents and lower loss.

In this aspect of the present disclosure, the distributed body bias network 530 is also configured with shunt body resistors $Rb_{shunt}$ that have varying resistance values (e.g., $Rb_{shunt1}$, $Rb_{shunt2}$, etc.) depending on the location in the stacked RF switch 500. In addition, the distributed body bias network 530 is configured with series body resistors having a varying resistance value (e.g., $Rb_{series1}$, $Rb_{series2}$, etc.) depending on the location (e.g., respective position) in the stacked RF switch 500. By contrast, in FIG. 4A, the distributed body bias network 430 is configured using shunt body resistors $Rb_{shunt}$ having the same value and series body resistors $Rb_{series}$ having the same value. This configuration increases the impedance seen by the bodies of the RF switch transistors 510 (e.g., 510-1) that are at higher RF node voltages using a combination of Rseries paths to break the inherent parallelism of Rgshunt network and consequently resulting in lower RF gate currents and lower loss.

Figure 5B:
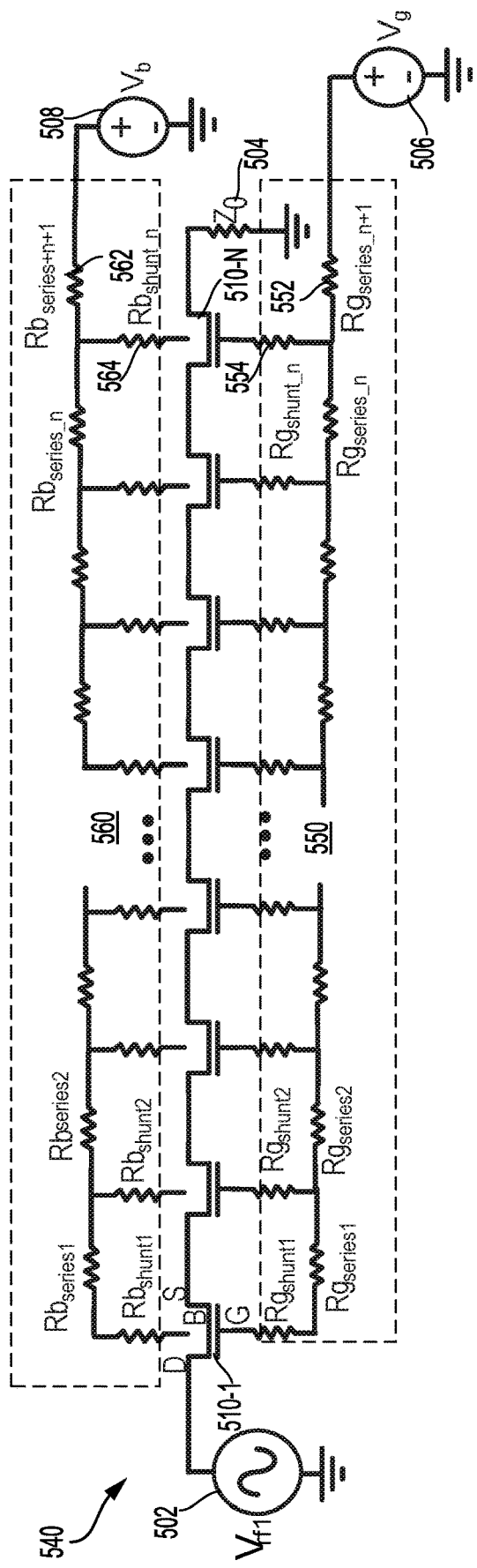

In the schematic representation of FIG. 5B, a stacked RF switch 540 is also configured with the RF switch transistors 510 (510-1, . . . , 510-N) of the stacked RF switch 500 of FIG. 5A. In this configuration, the stacked RF switch 540 includes a distributed gate bias network 550, which is a variation of the distributed gate bias network 520 shown in FIG. 5A. In this example, the distributed gate bias network 550 includes a last series gate resistor 552 (e.g., $Rg_{series\_n+1}$) coupled to a shunt gate resistor 554 (e.g., $Rg_{shunt\_n}$), which is coupled to the last of the RF switch transistors 510 (e.g., 510-N). In this configuration, the RF ground (e.g., the DC gate voltage ($V_g$) 506) is coupled to the last series gate resistor 552. This configuration of the distributed gate bias network 550 may be similar to the configuration of the distributed gate bias network 450 shown in FIG. 4B.

In this example, the stacked RF switch 540 includes a distributed body bias network 560, which is a variation of the distributed body bias network 530 shown in FIG. 5A. In this example, the distributed body bias network 560 includes a last series body resistor 562 (e.g., $Rb_{series\_n+1}$) coupled to a shunt body resistor 564 (e.g., $Rb_{shunt\_n}$). For example, the shunt body resistor 564 is coupled to the last of the RF switch transistors 510 (e.g., 510-N). In this configuration, the RF ground (e.g., DC body voltage ($V_b$) 508) is coupled to the last series body resistor 562. This configuration of the distributed body bias network 560 may be similar to the configuration of the distributed body bias network 460 shown in FIG. 4B.

Figure 5C:
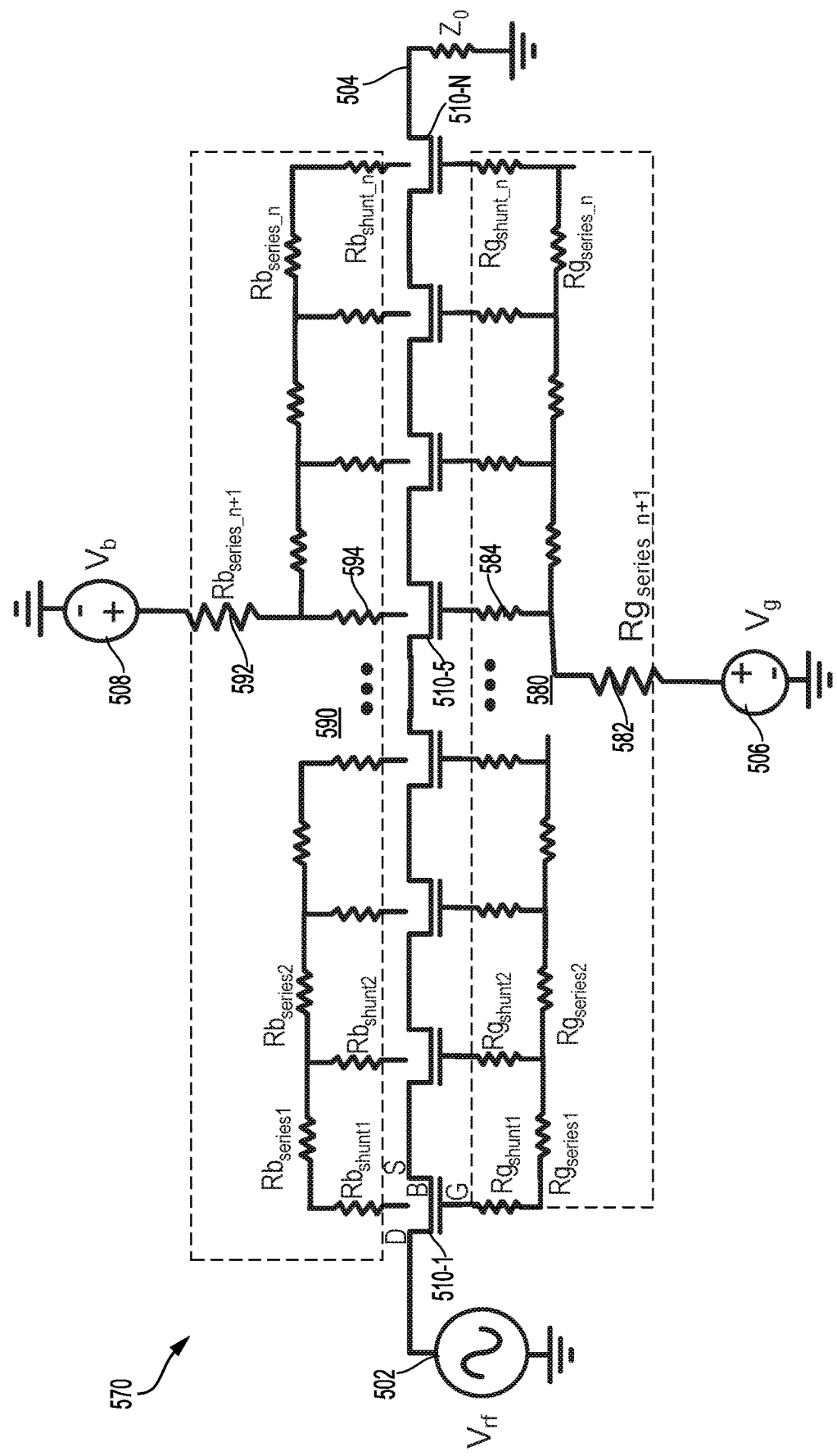

In the schematic representation of FIG. 5C, a stacked RF switch 570 is also configured with the RF switch transistors 510 (510-1, . . . , 510-N) of the stacked RF switch 500 of FIG. 5A. In this configuration, the stacked RF switch 570 includes a distributed gate bias network 580, which is a variation of the distributed gate bias network 520 shown in FIG. 5A. In this example, the distributed gate bias network 580 is configured with a series gate resistor 582 (e.g., $Rg_{series\_n+1}$) coupled to an intermediate node of the RF switch transistors 510 (e.g., 510-x) through a shunt gate resistor 584 based on the design optimization tradeoffs. In addition, the RF ground (e.g., DC gate voltage ($V_g$) 506) is coupled to the series gate resistor 582. This configuration of the distributed gate bias network 580 may be similar to the configuration of the distributed gate bias network 480 shown in FIG. 4C.

In one configuration, the stacked RF switch 570 also includes a distributed body bias network 590, which is a variation of the distributed body bias network 530 shown in FIG. 5A. In this example, the distributed body bias network 590 is configured with a series body resistor 592 (e.g., $Rb_{series\_n+1}$) coupled to intermediate node of the RF switch transistors 510 (e.g., 510-5) through a shunt body resistor 594 based on the design optimization tradeoffs. In addition, the RF ground (e.g., DC body voltage ($V_b$) 508) is coupled to the series body resistor 592. This configuration of the distributed body bias network 590 may be similar to the configuration of the distributed body bias network 490 shown in FIG. 4C.

Figure 5D:
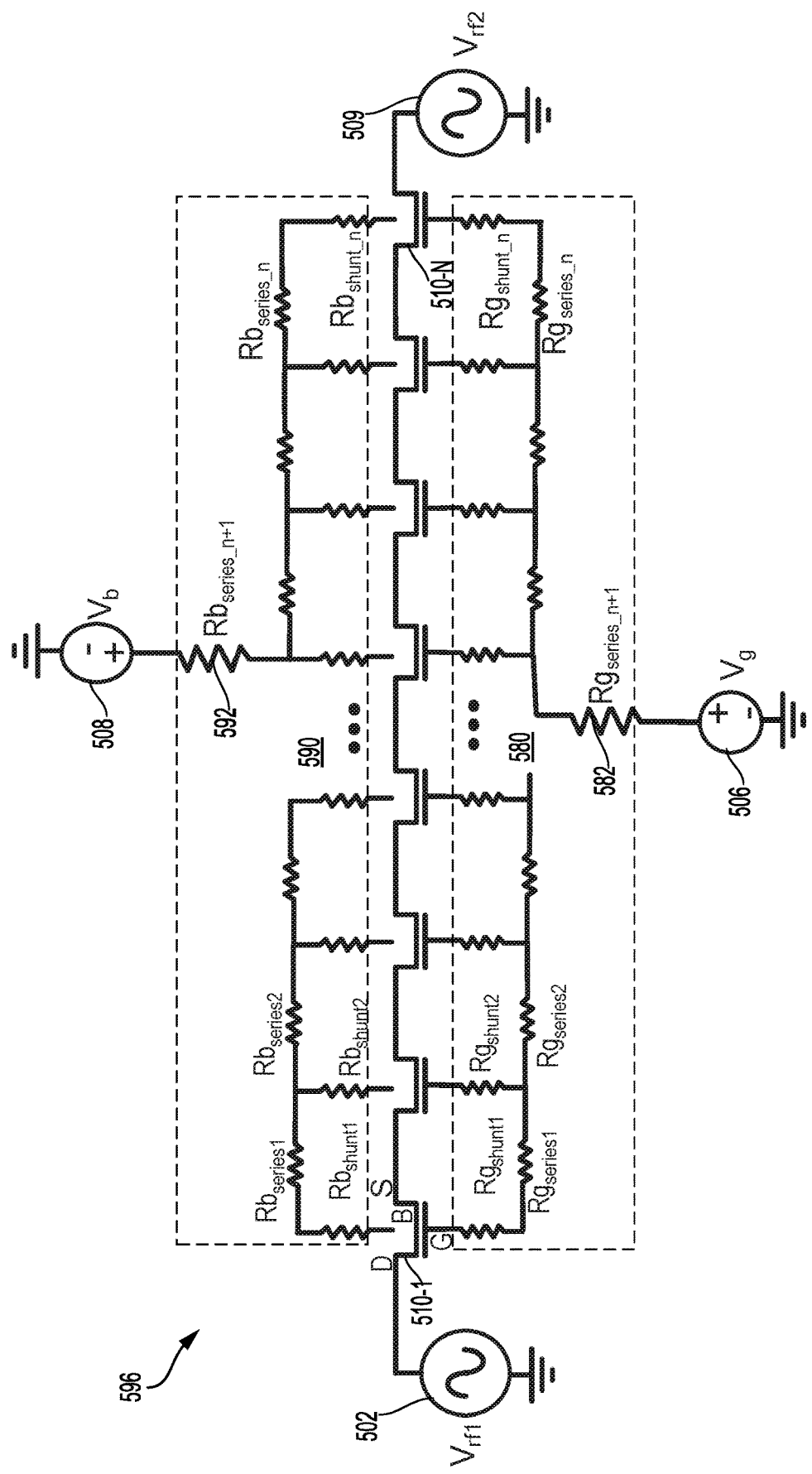

In the schematic representation of FIG. 5D, a stacked RF switch 596 is also configured with the RF switch transistors 510 (510-1, . . . , 510-N) of the stacked RF switch 500 of FIG. 5A. The RF switch transistors 510 are coupled in series to hold off a larger voltage than a single RF switch transistor is capable of handling. In this configuration, the stacked RF switch 596 includes the distributed gate bias network 580 and the distributed body bias network 590 of FIG. 5C. In this example, a first RF source 502 (e.g., a first RF voltage ($V_{rf1}$) is coupled to the drain (D) of the first of the RF switch transistors 510 (e.g., 510-1) and a second RF source 509 (e.g., an RF voltage ($V_{rf2}$)) is coupled to a source (S) of the last of the RF switch transistors 510 (e.g., 510-N). This configuration of the stacked RF switch 596 may be similar to the configuration of the stacked RF switch 496 shown in FIG. 4D.

For example, the stacked RF switch 596 may be implemented in a single pole multiple throw (SPnT) configuration. In this configuration, the first RF source 502 (e.g. $V_{rf1}$) is an antenna port and the second RF source 509 (e.g., $V_{rf2}$) is either coupled to a filter or a low noise amplifier (LNA). In an alternative configuration, the stacked RF switch 596 is implemented as a single pole single throw (SPST) configuration. In this alternative configuration, the throw is a ground rail, for example, a shunt switch transistor-to-ground (GND) or a load (e.g. $Z_0$).

Figure 6:
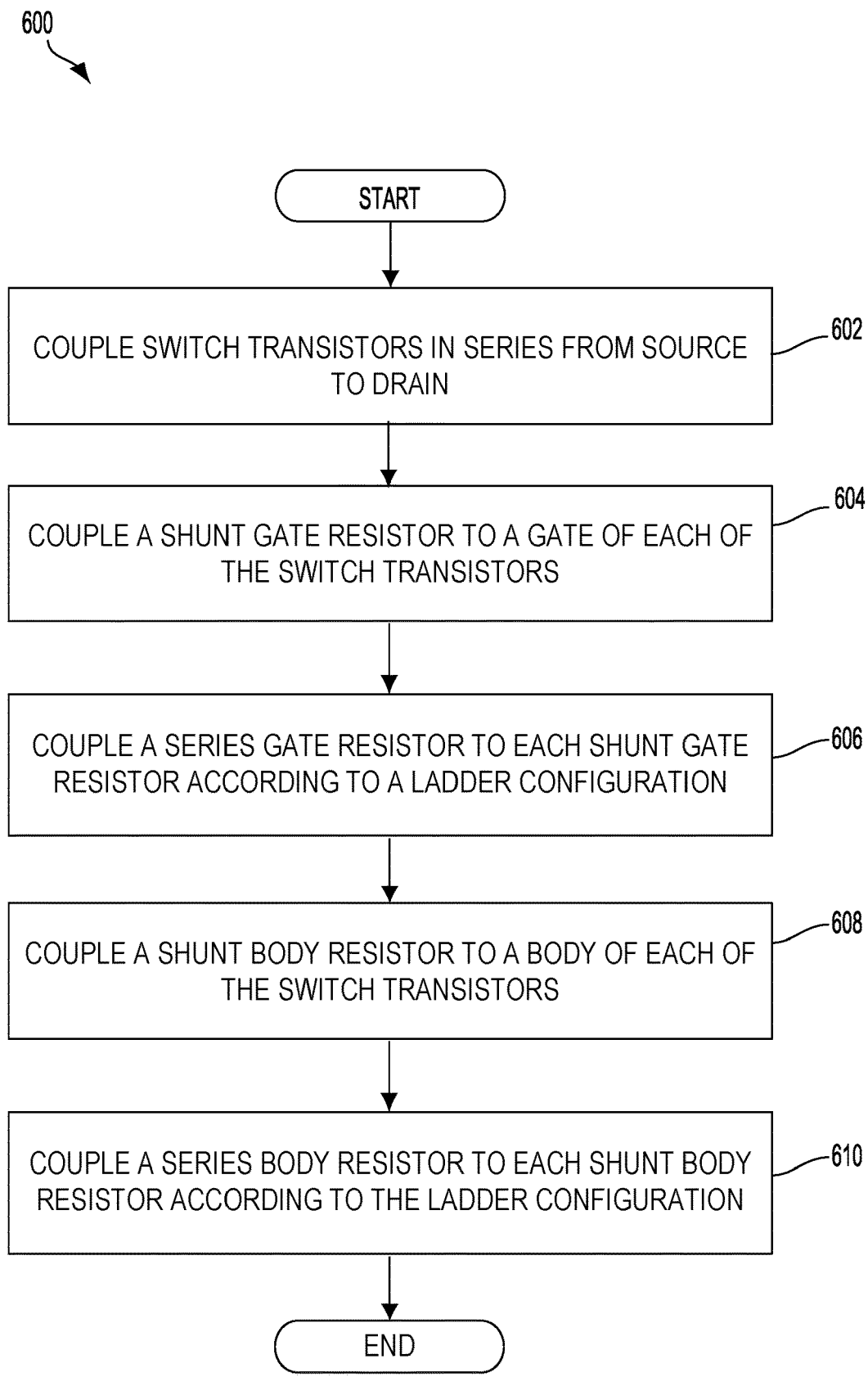
FIG. 6 is a process flow diagram illustrating a method of constructing a stacked radio frequency (RF) switch including a distributed gate bias network, according to aspects of the present disclosure.

FIG. 6 is a process flow diagram illustrating a method of constructing a radio frequency (RF) switch including a distributed gate bias network, according to aspects of the present disclosure. A method 600 begins at block 602, in which switch transistors are coupled in series from source to drain. For example, as shown in FIG. 4A, the RF switch transistors 410 are connected in series (e.g., source (S) to drain (D)), between the RF source 402 and the load 404 (e.g., impedance $Z_0$). At block 604, a shunt gate resistor is coupled to a gate of each of the switch transistors. For example, as shown in FIG. 4A, a shunt gate resistor ($Rg_{shunt}$) is coupled to a gate G of each of the RF switch transistors 410. At block 606, a series gate resistor is coupled to each shunt gate resistor according to a ladder configuration. For example, as shown in FIG. 4A, a series gate resistor ($Rg_{series}$) is coupled to each shunt gate resistor ($Rg_{shunt}$).

In this configuration of FIG. 4A, the distributed gate bias network 420 is coupled to each of the gates G of the RF switch transistors 410. By connecting the shunt gate resistors $Rg_{shunt}$ and series gate resistors $Rg_{series}$ in a ladder configuration, the distributed gate bias network 420 provides a larger gate resistance value for the higher voltage nodes of the RF switch transistors 410 (e.g., 410-1), which achieves a higher effective impedance for stacked transistors and lower parasitic loss to ground. In addition, the distributed gate bias network 420 provides a lower gate resistance value for the lower voltage nodes of the RF switch transistors 410 (e.g., 410-N). Providing the lower gate resistance value for the lower voltage nodes of the RF switch transistors 410 (e.g., 410-N) achieves a lower overall switching time to enable high frequency switching.

Referring again to FIG. 6, At block 608, a shunt body resistor is coupled to a body of each of the switch transistors. For example, as shown in FIG. 4A, a shunt body resistor ($Rb_{shunt}$) is coupled to a body B of each of the RF switch transistors 410. At block 610, a series body resistor is coupled to each shunt body resistor according to the ladder configuration. For example, as shown in FIG. 4A, a series body resistor ($Rb_{series}$) is coupled to each shunt body resistor ($Rb_{shunt}$).

The method 600 further includes configuring shunt resistors with a varying resistance value according to a position with respect to the switch transistors, for example as shown in FIG. 5A. The method 600 also includes configuring series resistors with a varying resistance value according to a position with respect to the switch transistors, for example as shown in FIG. 5B. The method 600 further includes configuring shunt resistors with a same resistance value, for example, as shown in FIG. 4A. The method also includes configuring series resistors with a same resistance value, for example, as shown in FIG. 4B.

According to aspects of the present disclosure, a stacked RF switch, including a distributed gate bias network, is described. The stacked RF switch has means for switching. The switching means may be the RF switch transistors 410/510, shown in FIGS. 4A-4D and 5A-5D. In another aspect, the aforementioned means may be any module or any apparatus configured to perform the functions recited by the aforementioned means.

Figure 7:
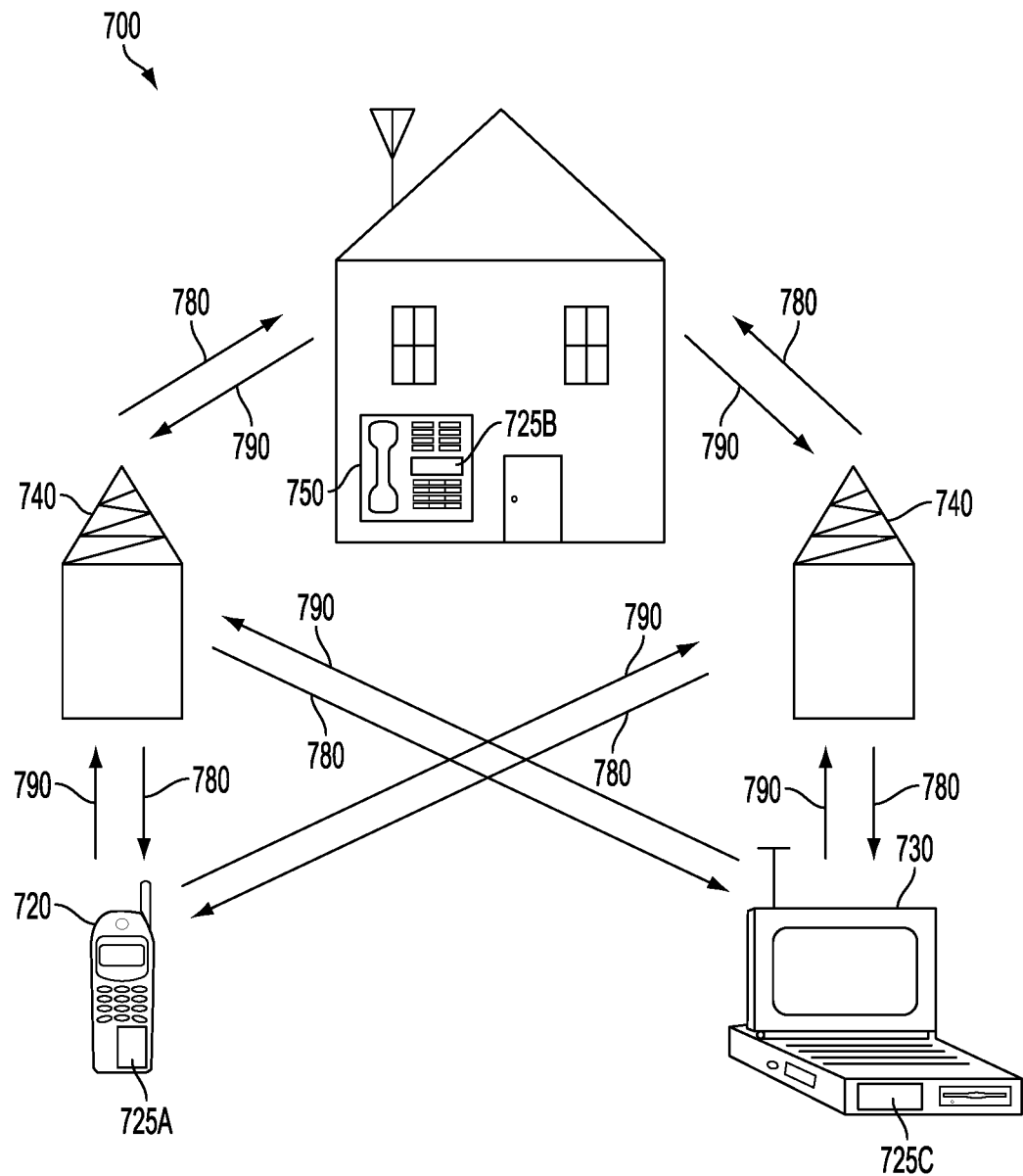
FIG. 7 is a block diagram showing an exemplary wireless communications system in which a configuration of the present disclosure may be advantageously employed.

FIG. 7 is a block diagram showing an exemplary wireless communications system 700 in which an aspect of the present disclosure may be advantageously employed. For purposes of illustration, FIG. 7 shows three remote units 720, 730, and 750 and two base stations 740. It will be recognized that wireless communications systems may have many more remote units and base stations. Remote units 720, 730, and 750 include IC devices 725A, 725B, and 725C that include the disclosed radio frequency integrated circuit (RFIC). It will be recognized that other devices may also include the disclosed RFIC, such as the base stations, switching devices, and network equipment. FIG. 7 shows forward link signals 780 from the base stations 740 to the remote units 720, 730, and 750, and reverse link signals 790 from the remote units 720, 730, and 750 to the base stations 740.

In FIG. 7, remote unit 720 is shown as a mobile telephone, remote unit 730 is shown as a portable computer, and remote unit 750 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 7 illustrates remote units, according to the aspects of the present disclosure, the present disclosure is not limited to these exemplary illustrated units. Aspects of the present disclosure may be suitably employed in many devices, which include the disclosed RFIC.

Figure 8:
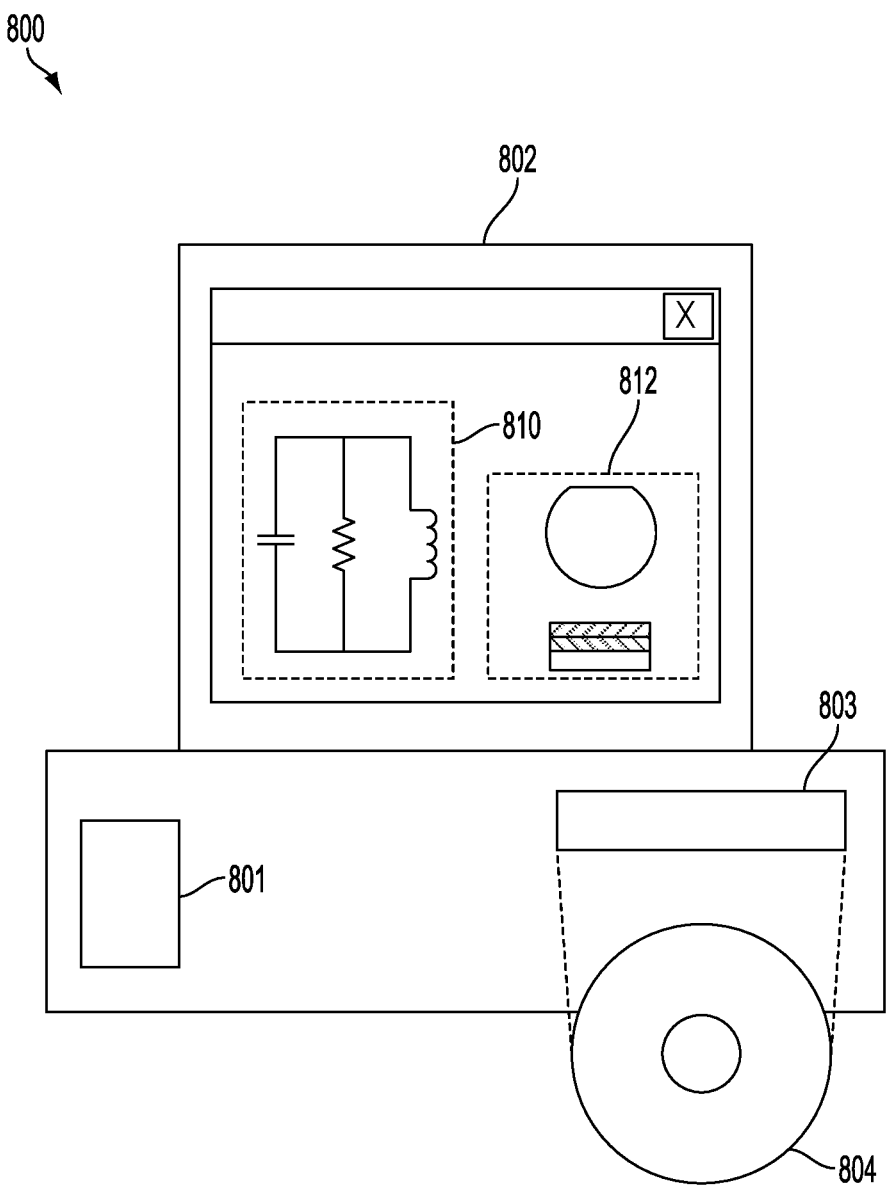
FIG. 8 is a block diagram illustrating a design workstation used for circuit, layout, and logic design of a semiconductor component, according to one configuration.

FIG. 8 is a block diagram illustrating a design workstation used for circuit, layout, and logic design of a semiconductor component, such as the radio frequency (RF) devices disclosed above. A design workstation 800 includes a hard disk 801 containing operating system software, support files, and design software such as Cadence or OrCAD. The design workstation 800 also includes a display 802 to facilitate a circuit design 810 or a stacked RF switch 812. A storage medium 804 is provided for tangibly storing the circuit design 810 or the stacked RF switch 812. The circuit design 810 or the stacked RF switch 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Implementation examples are described in the following numbered clauses:

1. A radio frequency (RF) switch, comprising:
a plurality of switch transistors coupled in series;
a distributed gate bias network coupled to gate electrodes of the plurality of switch transistors; and
a distributed body bias network coupled to body electrodes of the plurality of switch transistors.

2. The RF switch of clause 1, in which the distributed gate bias network comprises a plurality of shunt gate resistors and series gate resistors coupled in a ladder configuration.

3. The RF switch of clause 2, in which the plurality of shunt gate resistors have a varying resistance value according to a position with respect to the plurality of switch transistors.

4. The RF switch of any of clauses 2-3, in which the plurality of series gate resistors have a varying resistance value according to a position with respect to the plurality of switch transistors.

5. The RF switch of clause 2, in which the plurality of shunt gate resistors have a same resistance value.

6. The RF switch of any of clauses 2 and 5, in which the plurality of series gate resistors have a same resistance value.

7. The RF switch of any of clauses 2-6, in which a ratio between resistance values of the plurality of series gate resistors and the plurality of shunt gate resistors is within a predetermined range.

8. The RF switch of clause 7, in which the predetermined range comprises a range of 1/20 to 1/100.

9. The RF switch of any of clauses 1-8, in which the distributed body bias network comprises a plurality of shunt body resistors and a plurality of series body resistors coupled in a ladder configuration.

10. The RF switch of clause 9, in which the plurality of shunt body resistors have a varying resistance value according to a position with respect to the plurality of switch transistors.

11. The RF switch of any of clauses 9-10, in which the plurality of series body resistors have a varying resistance value according to a position with respect to the plurality of switch transistors.

12. The RF switch of clause 9, in which the plurality of shunt body resistors have a same resistance value.

13. The RF switch of any of clauses 9 and 12, in which the plurality of series body resistors have a same resistance value.

14. The RF switch of any of clauses 9-13, in which a ratio between resistance values of the plurality of series body resistors and the plurality of shunt body resistors is within a predetermined range.

15. The RF switch of clause 14, in which the predetermined range comprises a range of 1/20 to 1/100.

16. The RF switch of any of clauses 1-15, integrated into an RF front-end module, the RF front-end module incorporated into at least one of a music player, a video player, an entertainment unit, a navigation device, a communications device, a personal digital assistant (PDA), a fixed location data unit, a mobile phone, and a portable computer.

17. A method of constructing a radio frequency (RF) switch, the method comprising:
coupling a plurality of switch transistors in series;
coupling a shunt gate resistor to a gate of each of the plurality of switch transistors;
coupling a series gate resistor to each shunt gate resistor according to a ladder configuration;
coupling a shunt body resistor to a body of each of the plurality of switch transistors; and
coupling a series body resistor to each shunt body resistor according to the ladder configuration.

18. The method of clause 17, further comprising configuring shunt gate resistors and shunt body resistors with a varying resistance value according to a position with respect to the plurality of switch transistors.

19. The method of any of clauses 17-18, further comprising configuring series gate resistors and series body resistors with a varying resistance value according to a position with respect to the plurality of switch transistors.

20. The method of clause 17, further comprising configuring shunt gate resistors and shunt body resistors with a same resistance value.

21. The method of any of clauses 17 and 20, further comprising configuring series gate resistors and series body resistors with a same resistance value.

22. The method of any of clauses 17-21, further comprising integrating the RF switch into an RF front-end module, the RF front-end module incorporated into at least one of a music player, a video player, an entertainment unit, a navigation device, a communications device, a personal digital assistant (PDA), a fixed location data unit, a mobile phone, and a portable computer.

23. A radio frequency (RF) front-end circuit, comprising:
an RF switch including a plurality of switch transistors coupled in series, a distributed gate bias network coupled to gate electrodes of the plurality of switch transistors, and a distributed body bias network coupled to body electrodes of the plurality of switch transistors; and
an antenna coupled to the RF switch.

24. The RF front-end circuit of clause 23, in which the distributed gate bias network comprises a plurality of shunt gate resistors and series gate resistors coupled in a ladder configuration.

25. The RF front-end circuit of clause 24, in which the plurality of shunt gate resistors have a first varying resistance value according to a position with respect to the plurality of switch transistors, and the plurality of series gate resistors have a second varying resistance value according to a position with respect to the plurality of switch transistors.

26. The RF front-end circuit of any of clauses 24-25, in which a ratio between resistance values of the plurality of series gate resistors and the plurality of shunt gate resistors is within a predetermined range.

27. The RF front-end circuit of any of clauses 23-26, in which the distributed body bias network comprises a plurality of shunt body resistors and series body resistors coupled in a ladder configuration.

28. The RF front-end circuit of clause 27, in which the plurality of shunt body resistors have a first varying resistance value according to a position with respect to the plurality of switch transistors, and the plurality of series body resistors have a second varying resistance value according to a position with respect to the plurality of switch transistors.

29. The RF front-end circuit of any of clauses 27-28, in which a ratio between resistance values of the plurality of series body resistors and the plurality of shunt body resistors is within a predetermined range.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the stacked RF switch 812 by decreasing the number of processes for designing semiconductor wafers.

For a firmware and/or software implementation, the methodologies may be implemented with modules (e.g., procedures, functions, and so on) that perform the functions described. A machine-readable medium tangibly embodying instructions may be used in implementing the methodologies described. For example, software codes may be stored in a memory and executed by a processor unit. Memory may be implemented within the processor unit or external to the processor unit. As used, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described may be utilized according to the present disclosure. Accordingly, the appended claims are intended to include within their scope such processes, machines, manufacture, compositions of matter, means, methods, or steps.

What is claimed is:

1. A radio frequency (RF) switch, comprising:
a plurality of switch transistors coupled in series between a source and a load, a first of the plurality of switch transistors directly coupled to the source, a last of the plurality of switch transistors directly coupled to the load, and each of the plurality of switch transistors directly coupled to an immediately adjacent switch transistor;
a distributed gate bias network decoupled from the source and the load, the distributed gate bias network comprising a plurality of shunt gate resistors, each respective shunt gate resistor coupled to a respective gate electrode of the plurality of switch transistors and a plurality of series gate resistors coupled in series and each respective series gate resistor coupled between a respective pair of the plurality of shunt gate resistors; and
a distributed body bias network coupled to body electrodes of the plurality of switch transistors,
in which a ratio between resistance values of the plurality of series gate resistors and the plurality of shunt gate resistors is within a range of 1/20 to 1/100.

2. The RF switch of claim 1, in which the plurality of shunt gate resistors have a varying resistance value according to a position with respect to the plurality of switch transistors.

3. The RF switch of claim 1, in which the plurality of series gate resistors have a varying resistance value according to a position with respect to the plurality of switch transistors.

4. The RF switch of claim 1, in which the plurality of shunt gate resistors have a same resistance value.

5. The RF switch of claim 1, in which the plurality of series gate resistors have a same resistance value.

6. The RF switch of claim 1, in which the distributed body bias network comprises a plurality of shunt body resistors, each respective shunt body resistor coupled to a respective body electrode of the plurality of switch transistors, and a plurality of series body resistors coupled in series and each respective series body resistor coupled between a respective pair of the plurality of shunt body resistors.

7. The RF switch of claim 6, in which the plurality of shunt body resistors have a varying resistance value according to a position with respect to the plurality of switch transistors.

8. The RF switch of claim 6, in which the plurality of series body resistors have a varying resistance value according to a position with respect to the plurality of switch transistors.

9. The RF switch of claim 6, in which the plurality of shunt body resistors have a same resistance value.

10. The RF switch of claim 6, in which the plurality of series body resistors have a same resistance value.

11. The RF switch of claim 6, in which a ratio between resistance values of the plurality of series body resistors and the plurality of shunt body resistors is within a predetermined range.

12. The RF switch of claim 11, in which the predetermined range comprises a range of 1/20 to 1/100.

13. The RF switch of claim 1, integrated into an RF front-end module, the RF front-end module incorporated into at least one of a music player, a video player, an entertainment unit, a navigation device, a communications device, a personal digital assistant (PDA), a fixed location data unit, a mobile phone, and a portable computer.

14. A method of constructing a radio frequency (RF) switch, the method comprising:
coupling a plurality of switch transistors in series between a source and a load, a first of the plurality of switch transistors directly coupled to the source, a last of the plurality of switch transistors directly coupled to the load, and each of the plurality of switch transistors directly coupled to an immediately adjacent switch transistor;
coupling each respective shunt gate resistor of a plurality of shunt gate resistors to a respective gate of each of the plurality of switch transistors;
coupling each series gate resistor of a plurality of series gate resistors between a respective pair of the plurality of shunt gate resistors, in which the plurality of series gate resistors are coupled in series and decoupled from the source and the load;
coupling each respective shunt body resistor of a plurality of shunt body resistors to a respective body of each of the plurality of switch transistors; and
coupling each series body resistor of a plurality of series body resistors between a respective pair of the plurality of shunt body resistors, in which the plurality of series body resistors are coupled in series,
in which a ratio between resistance values of the plurality of series gate resistors and the plurality of shunt gate resistors is within a range of 1/20 to 1/100.

15. The method of claim 14, further comprising configuring the plurality of shunt gate resistors and the plurality of shunt body resistors with a varying resistance value according to a position with respect to the plurality of switch transistors.

16. The method of claim 14, further comprising configuring the plurality of series gate resistors and the plurality of series body resistors with a varying resistance value according to a position with respect to the plurality of switch transistors.

17. The method of claim 14, further comprising configuring the plurality of shunt gate resistors with a first resistance value and configuring the plurality of shunt body resistors with a second resistance value.

18. The method of claim 14, further comprising configuring the plurality of series gate resistors with a first resistance value and configuring the plurality of series body resistors with a second resistance value.

19. The method of claim 14, further comprising integrating the RF switch into an RF front-end module, the RF front-end module incorporated into at least one of a music player, a video player, an entertainment unit, a navigation device, a communications device, a personal digital assistant (PDA), a fixed location data unit, a mobile phone, and a portable computer.

20. A radio frequency (RF) front-end circuit, comprising:
an RF switch including a plurality of switch transistors coupled in series between a source and a load, a first of the plurality of switch transistors directly coupled to the source, a last of the plurality of switch transistors directly coupled to the load, and each of the plurality of switch transistors directly coupled to an immediately adjacent switch transistor, a distributed gate bias network decoupled from the source and the load, the distributed gate bias network comprising a plurality of shunt gate resistors, each respective shunt gate resistor coupled to a respective gate electrode of the plurality of switch transistors and a plurality of series gate resistors coupled in series and each respective series gate resistor coupled between a respective pair of the plurality of shunt gate resistors, and a distributed body bias network coupled to body electrodes of the plurality of switch transistors, in which a ratio between resistance values of the plurality of series gate resistors and the plurality of shunt gate resistors is within a range of 1/20 to 1/100; and
an antenna coupled to the RF switch.

21. The RF front-end circuit of claim 20, in which the plurality of shunt gate resistors have a first varying resistance value according to a position with respect to the plurality of switch transistors, and the plurality of series gate resistors have a second varying resistance value according to a position with respect to the plurality of switch transistors.

22. The RF front-end circuit of claim 20, in which the distributed body bias network comprises a plurality of shunt body resistors, each respective shunt body resistor coupled to a respective body electrode of the plurality of switch transistors, and a plurality of series body resistors coupled in series and each respective series body resistor coupled between a respective pair of the plurality of shunt body resistors.

23. The RF front-end circuit of claim 22, in which the plurality of shunt body resistors have a first varying resistance value according to a position with respect to the plurality of switch transistors, and the plurality of series body resistors have a second varying resistance value according to a position with respect to the plurality of switch transistors.

24. The RF front-end circuit of claim 22, in which a ratio between resistance values of the plurality of series body resistors and the plurality of shunt body resistors is within a predetermined range.

* * * * *